United States Patent [19]
Davis et al.

[11] Patent Number: 4,713,680
[45] Date of Patent: Dec. 15, 1987

[54] SERIES RESISTIVE NETWORK

[75] Inventors: William F. Davis; Robert L. Vyne, both of Tempe, Ariz.

[73] Assignee: Motorola, Inc., Schaumburg, Ill.

[21] Appl. No.: 880,538

[22] Filed: Jun. 30, 1986

[51] Int. Cl.[4] .................. H01L 29/06; H01L 23/48; H01L 29/44; H01L 21/479
[52] U.S. Cl. ............................ 357/51; 357/60; 357/68; 29/584; 29/586; 148/183; 437/51; 437/170
[58] Field of Search ............ 357/51, 68, 60; 29/584, 29/586; 148/183

[56] References Cited

U.S. PATENT DOCUMENTS

| | | | |
|---|---|---|---|
| 3,965,453 | 6/1976 | Seidel et al. | 357/60 |
| 4,065,971 | 1/1978 | Shimazoe et al. | 357/60 |
| 4,268,848 | 5/1981 | Casey et al. | 357/60 |
| 4,562,451 | 12/1985 | Fuse | 357/51 |
| 4,606,781 | 8/1986 | Vyne | 357/51 |
| 4,652,812 | 3/1987 | Gimpelson et al. | 357/68 |

FOREIGN PATENT DOCUMENTS

| | | | |
|---|---|---|---|
| 57-24563 | 2/1982 | Japan | 357/51 |
| 60-74662 | 4/1985 | Japan | 357/51 |
| 60-178658 | 9/1985 | Japan | 357/51 |

Primary Examiner—Andrew J. James
Assistant Examiner—Jerome Jackson
Attorney, Agent, or Firm—Vincent B. Ingrassia

[57] ABSTRACT

First and second resistors of a resistive network formed in a semiconductive substrate may be individually trimmed. The first and second resistive regions coupled at one end thereof have their other ends provided with metallic contacts. The resistive regions are disposed on the substrate such that current flowing from the first metallic contact to the second metallic contact through the first and second resistive regions causes the resistance of the first resistive region to be reduced. In contrast, current flowing from the second metallic contact to the first metallic contact through the first and second resistive regions causes the resistance of the second resistive region to be reduced.

11 Claims, 4 Drawing Figures

SERIES RESISTIVE NETWORK

CROSS REFERENCE TO RELATED APPLICATIONS

This application is related to U.S. patent application Ser. No. 662,109 filed Oct. 18, 1984 and entitled METHOD FOR RESISTOR TRIMMING BY METAL MIGRATION.

BACKGROUND OF THE INVENTION

This invention relates generally to semiconductor resistive networks and, more particularly, to a semiconductive series resistive network comprised of resistors which may be individually trimmed.

The above referenced patent application discloses a diffused resistor on an integrated circuit die which may be trimmed by metal migration. This is accomplished by pulsing the resistor with high amplitude, small duty cycle current pulses. The approach is especially useful in production and has definite advantages over laser trimming, link blowing, or zener zapping. First, the resistors can now be trimmed after the integrated circuit is packaged. Second, the resistors trimmed by metal migration (RTMM) occupy very little die area. Third, in some integrated circuits, 25% of the die area is required for trim and protection circuitry. Using RTMM resistors, a test computer performs a trim algorithm, not digital logic on the chip. Fourth, RTMM resistors exhibit increased accuracy and resolution. That is, they undergo resistance changes as small as 25 milli ohms/pulse on a 25 ohm resistor. Finally, no additional expensive equipment is required. The part is trimmed at the same time it is probed or finally tested using the same equipment.

Assuming a silicon substrate and aluminum contacts, when small duty cycle current pulses are applied to the RTMM resistors, electron momentum exchange causes some movement of silicon and aluminum atoms in the direction of current flow, commonly referred to as electromigration. As the resistor temperature rises, however, the ability of aluminum to dissolve silicon increases. This phenomenon causes an aluminum filament to grow from the positive terminal, dissolving silicon as it grows, toward the negative terminal, against the flow of electrons. As the filament grows, the resistive value decreases.

It should thus be clear that no more than two trim pads are necessary to trim an RTMM resistor. Obviously, however, many circuits include more than one resistor which must be trimmed and it would be impractical to provide two trim pads for each such resistor.

SUMMARY OF THE INVENTION

It is an object of the present invention to provide a semiconductor resistive network wherein more than one resistor may be individually trimmed utilizing no more than a total of two trim pads.

According to a broad aspect of the invention there is provided a resistive circuit formed in a semiconductor substrate, comprising a first resistive region in the substrate having first and second ends; a second resistor region in the substrate having first and second ends, the second end of the first region electrically coupled to the first end of the second region; a first metallic contact for contacting the first region proximate its first end; and a second metallic contact for contacting the second region proximate its second end, the first and second regions being directionally oriented on the substrate such that conventional current flowing from the first contact toward the second contact will cause metal to migrate in a direction from the first contact toward the second end of the first region, and current flowing from the second contact toward the first contact will cause metal to migrate in a direction from the second contact toward the first end of the second region.

According to a further aspect of the invention there is provided a method for individually trimming at least first and second passive devices formed in a semiconductor substrate, comprising forming a first resistive region in the substrate having first and second ends; forming a second resistive region in the substrate having third and fourth ends, the third end being electrically coupled to the second end; forming a first metallic contact proximate the first end; forming a second metallic contact proximate the fourth end; passing current through the first and second regions in a first direction to reduce the resistance of the first resistive region; and passing current through the first and second regions in a second direction to reduce the resistance of said second resistive region.

The above and other objects, features and advantages of the present invention will be more clearly understood from the following detailed description taken in conjunction with the accompanying drawings in which:

DESCRIPTION OF THE PRESENT INVENTION

Figure 1:
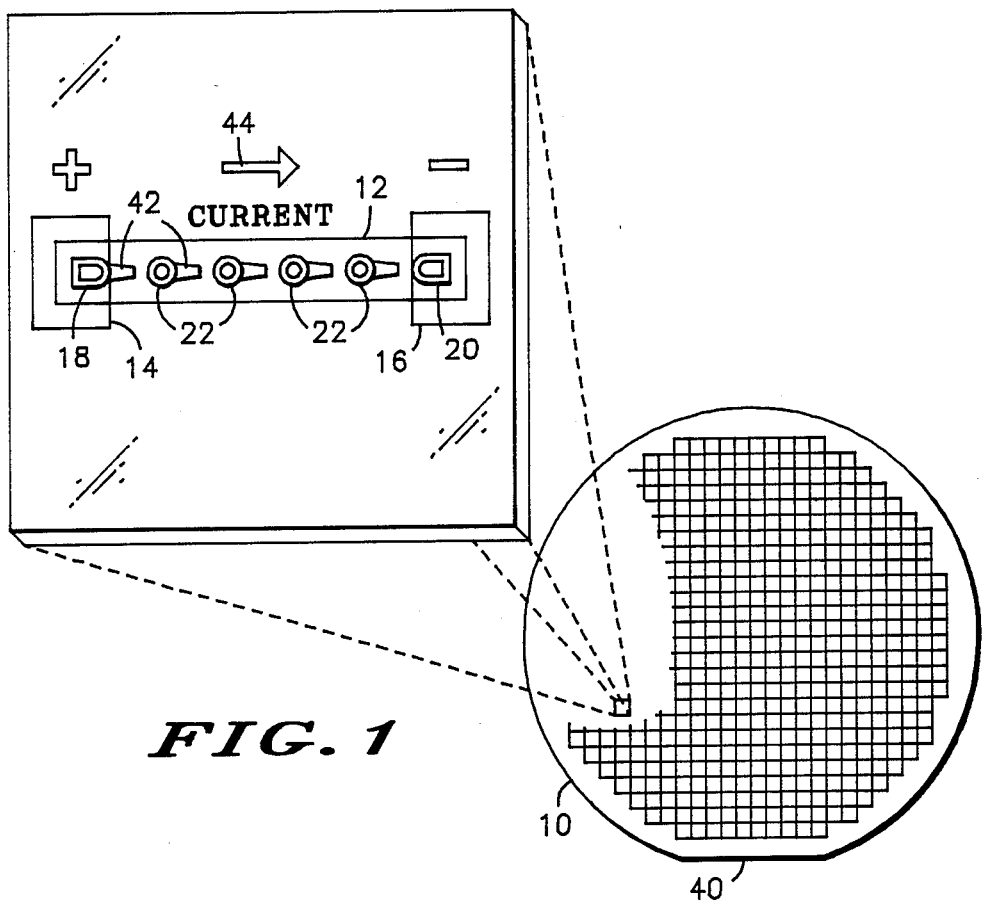
FIG. 1 is a top view of an RTMM resistor on a semiconductor wafer trimmed by passing current pulses therethrough in a proper direction.

FIG. 1 is a top exploded view of a {111} oriented silicon wafer 10 having a diffused resistor 12 thereon. Contact pads 14 and 16 are provided for contacting metallic (e.g. aluminum) contacts 18 and 20 respectively at opposite ends of the resistor. In addition, a plurality of intermediate metallic contacts 22 are provided.

Figure 2:
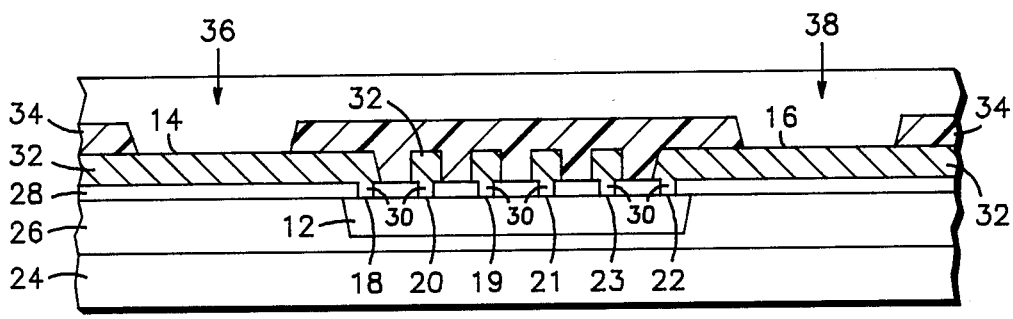
FIG. 2 illustrates in cross-section the RTMM resistor of FIG. 1.

FIG. 2 is a cross-sectional view illustrating the typical manner in which the resistor shown in FIG. 1 is constructed. A P-type silicon substrate 24 is covered by an N-type epitaxial layer 26. Resistive region 12 is formed by, for example, diffusing an N-type dopant into epitaxial layer 26. An insulating layer 28, preferably nitride, is deposited over epitaxial layer 26 and openings 30 are etched therein. A metal layer 32 is then deposited over the insulating layer 28 and into openings 30 thus creating metal contacts 18, 19, 20, 21, 22 and 23. A protective glass layer 34 is deposited over metal 32 and openings 36 and 38 formed therein so as to provide access to pads 14 and 16.

Figure 3:
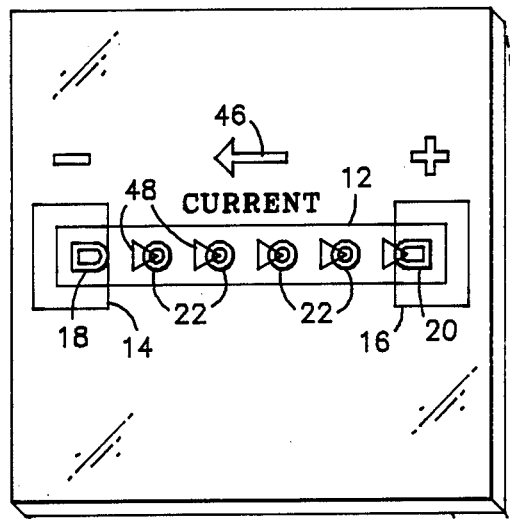
FIG. 3 is a top view of an RTMM resistor on a semiconductor wafer trimmed by passing current therethrough in an improper direction.
Figure 3:
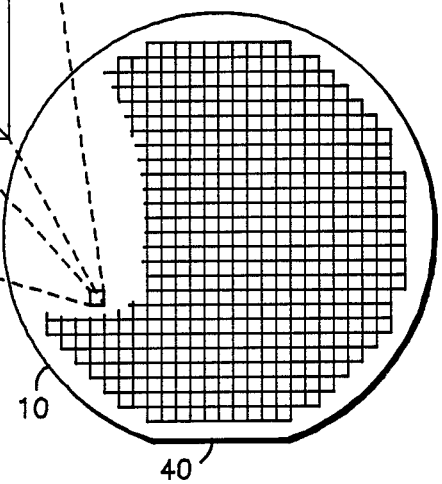

It was discovered that when using a {111} oriented silicon wafer 10 having a diffused resistor 12 running parallel to the {110} flat 40 that there was a difference in the shape of the aluminum flow into the silicon towards the negative terminal that was dependent upon the direction of electron flow in resistor 12 during trimming. That is, referring to wafer 10 in FIG. 1 having a flat 40 at the bottom (6 o'clock), if the electron flow is from right to left and standard current is from left to right as indicated by arrow 44, a narrow filament of aluminum 42 is observed to grow from contacts 18 and 22 into the silicon to the right of that contact. If, however, electron flow during trim is from left to right and standard current is from right to left as indicated by arrow 46 in FIG. 3, a comparatively wide area of aluminum 48 forms to the left of the aluminum contact.

This behavior is attributed to the directions of the {111} crystal planes in the silicon relative to the direction of the aluminum-silicon alloy filament growth. The {111} planes are the close-packed planes making it most difficult to dissolve silicon in direction normal to these planes. The dissolving of silicon takes place more readily in directions that are not normal to the {111} planes. Thus, it is much easier for the silicon to dissolve in any of the three directions corresponding to the intersection of the {111} planes than it does normal to the {111} planes. If a resistor to be trimmed is formed parallel to the wafer flat, a narrow filament of aluminum-silicon alloy grows to the right when the trimming high current electrons flow to the left (viewed with the wafer flat at 6 o'clock). The filament is fairly narrow since widening of the filament would require dissolution in a direction with a component normal to the (111) plane.

If, on the other hand, the trimming current were reversed so that electrons move from left to right in the above oriented resistor, a very wide filament of aluminum-silicon alloy would grow to the left of the contacts since it is easier to dissolve silicon from the crystal in directions parallel to the {111} planes than near normal to them.

Since there are three directions in the {111} oriented crystals in which etch pit facets intersect, there are three optimum directions in which resistors can be constructed. These are 120 degrees apart and are in the crystal directions [11$\bar{2}$], [1$\bar{2}$1] and [$\bar{2}$11]. A narrow filament of alloy would grow from an ohmic contact in a direction opposite to the electron flow if the electron flow were directed towards a point of the etch pit. Similarly, a wide filament would grown from the ohmic contact opposite the direction of electron flow if the electron flow were directed towards a flat of the etch pit.

In the case of a {100} oriented silicon wafer, there are two directions in which the {111} planes intersect to form a four-sided pyramid shaped etch pit. Thus, there are two directions along which trimmable resistors can be constructed which would produce narrow filaments in the direction opposite to the electron flow. These are the [010] and the [001] directions and are located at angles 45 degrees and 135 degrees from the [011] oriented flat. A more detailed discussion of the crystallographic orientation of silicon wafers can be found in "OPTIMUM CRYSTALLOGRAPHIC ORIENTATION FOR SILICON DEVICE FABRICATION" by Duane O. Townley, Solid State Technology, January, 1973, pages 37-41.

As suggested above, the directions in which resistors can be directed and exhibit the desired natural filament growth are related to etch pit. That is, the etch pit in {111} silicon consists of three intersecting {111} planes forming a tetrahedron shaped pit. The intersections of the {111} planes point in three directions 120 degrees apart. It will be noted that an etch pit point containing an intersection of two (111) planes is directed parallel to the flat of the wafer and to the right. To the left of the etch pit there exists a (111) plane. Thus, it is easier to dissolve silicon from the crystal into the alloy along the intersection of two (111) planes to the right than it would from the (111) plane to the left.

Figure 4:
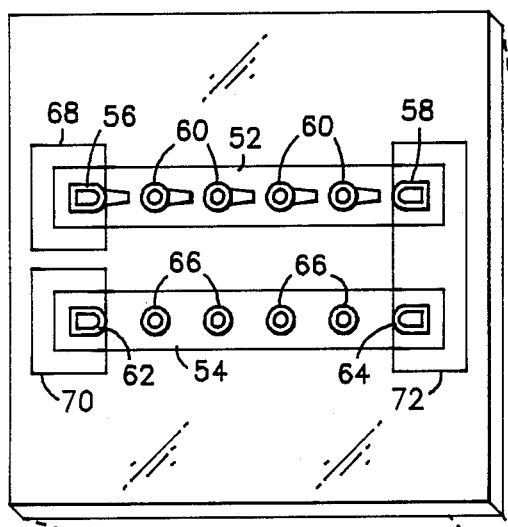
FIG. 4 is a top view of an RTMM resistor pair on a semiconductor wafer in accordance with the present invention.
Figure 4:
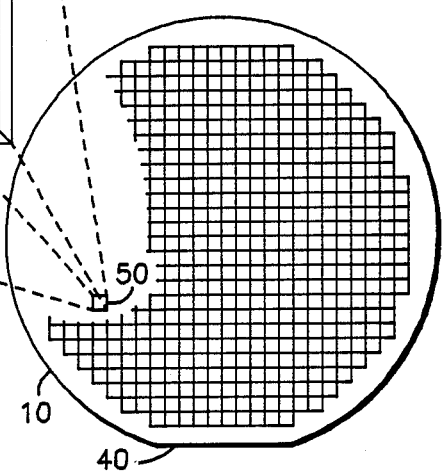

It is the directional trimming characteristic of RTMM resistors that gives rise to the present invention; i.e. the ability to individually trim first and second resistors utilizing only two trim pads. Referring to FIG. 4, a {111} silicon wafer 10 having flat 40 includes an individual die 50 having formed therein first and second resistor regions 52 and 54 of the type described hereinabove. Resistor 52 is provided with first and second metallic end contacts 56 and 58 and a plurality of intermediate metallic contacts 60. Resistor 54 is provided with first and second metallic end contacts 62 and 64 and a plurality of intermediate metallic contacts 66. Contacts 56 is provided with contact pad 68, and contact 62 is provided with contact pad 70. An additional contact 72 couples metallic contacts 58 in resistor 52 and 64 in resistor 54 together. Based on the previous discussion, it should be apparent that both resistors 52 and 54 are oriented on die 50 in a preferred crystallographic direction. As stated previously, a narrow filament of aluminum-silicon alloy is expected to grow to the right when the trimming high current electrons flow to the left. Therefore, if it were desired to trim resistor 52, the low duty cycle high current pulses would be caused to flow from contact pad 68 to contact pad 70. In this manner, current flows from left to right in resistor 52 causing it to be trimmed. However, in resistor 54, the current is flowing from right to left and therefore trimming does not occur. When it is desired to trim resistor 54, the current pulses are caused to flow from contact pad 70 toward contact pad 68. Now, current is flowing in the proper preferred direction through resistor 54 causing resistor 54 to be trimmed while the value of resistor 52 remains substantially unchanged.

Thus, an approach has been described whereby the first and second resistors may be individually trimmed utilizing no more than two trimming pads. This can be accomplished after packaging.

The above description is given by way of example only. Changes in form and details may be made by one skilled in the art without departing from the scope of the invention as defined by the appended claims.

We claim:

1. A resistive circuit formed in a semiconductor substrate, comprising:

a first resistive region in said substrate having first and second ends;

a second resistive region in said substrate having first and second ends, the second end of said first region electrically coupled to the first end of said second region;

a first metallic contact for contacting said first region proximate its first end; and a second metallic contact for contacting said second region proximate its second end, said first and second regions being directionally oriented on said substrate such that current flowing from said first contact toward said second contact will cause metal of said first metallic contact to migrate in a direction from said first contact toward the second end of said first region, and current flowing from said second contact toward said first contact will cause metal to migrate in a direction from said second contact toward the first end of said second region.

2. A resistive circuit according to claim 1 wherein said first and second regions are directionally oriented on said substrate such that current flowing between said first and second contacts flows in first and second different directions in said first and second regions respectively.

3. A resistive circuit formed in semiconductive substrate, comprising:
   a first resistor formed in said substrate including a first resistive region having first and second ends and a first metallic contact proximate said first end; and
   a second resistor formed in said substrate including a second resistive region having first and second ends and a second metallic contact proximate said second end, the second end of said first region electrically coupled to the first end of said second region, said first and second regions being directionally oriented on said substrate such that current flowing from said first contact toward said second contact will decrease the resistance of said first resistor, and current flowing from said second contact toward said first contact will decrease the resistance of said second resistor.

4. A resistive circuit according to claim 3 wherein current flowing from said first contact to said second contact flows in said first and second regions in first and second different directions respectively, and current flowing from said second contact to said first contact flows in said second and first resistive regions in third and fourth different directions respectively.

5. A resistive circuit formed in a {111} crystalline semiconductive substrate, comprising:
   a first resistive region in said substrate having first and second ends;
   a second resistive region in said substrate having first and second ends, the second end of said first region electrically coupled to the first end of said second region;
   a first metallic contact for contacting said first region proximate its first end; and
   a second metallic contact for contacting said second region proximate its second end, said first and second regions being individually disposed in directions selected from the group consisting of [11$\bar{2}$], [1$\bar{2}$1], and [$\bar{2}$11], such that current flowing from said first contact to said second contact flows in substantially different directions in said first and second regions, and current flowing from said second contact to said first contact flows in substantially different third and fourth directions in said first and second regions.

6. A resistive circuit formed in a {111} crystal and semiconductor substrate, comprising:
   a first resistive region in said substrate having first and second ends;
   a second resistive region in said substrate having first and second ends, the second end of said first region electrically coupled to the first end of said second region;
   a first metallic contact for contacting said first region proximate its first end; and
   a second metallic contact for contacting said second region proximate its second end wherein each of said first and second regions are both disposed in a single direction selected from the group consisting of [11$\bar{2}$], [1$\bar{2}$1], and [$\bar{2}$11], such that current flowing from said first contact to said second contact flows in opposite directions in said first and second regions, and current flowing from said second contact to said first contact flows in opposite directions in said first and second regions.

7. A resistive circuit according to claim 6 wherein said first and second regions are directionally disposed parallel to the [1$\bar{2}$1] direction.

8. A resistive circuit according to claim 7 wherein said semiconductor substrate is silicon and said first and second metallic contacts are aluminum.

9. A method for individually trimming at least first and second passive devices formed in a semiconductor substrate, comprising:
   forming a first resistive region in said substrate having first and second ends;
   forming a second resistive region in said substrate having third and fourth ends, said third end being electrically coupled to said second end;
   forming a first metallic contact proximate said first end;
   forming a second metallic contact proximate said fourth end;
   passing current through said first and second regions in a first direction to reduce the resistance of said first resistive regions; and
   passing current through said first and second regions in a second direction to reduce the resistance of said second resistive region.

10. A method according to claim 9 wherein metal migrates from said first metallic contact toward the second end of said first resistive region to reduce to resistance thereof.

11. A method according to claim 10 wherein metal migrates from said second metallic contact toward said third end of said second resistive region to reduce the resistance thereof.

* * * * *